US012563924B2

(12) United States Patent
Shang et al.

(10) Patent No.:     US 12,563,924 B2
(45) Date of Patent:          Feb. 24, 2026

(54) DISPLAY SUBSTRATE AND METHOD OF MANUFACTURING THE SAME, DISPLAY PANEL, AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Tinghua Shang, Beijing (CN); Lili Du, Beijing (CN); Benlian Wang, Beijing (CN); Yao Huang, Beijing (CN); Qi Qi, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 556 days.

(21) Appl. No.: 18/023,406

(22) PCT Filed: Jan. 29, 2022

(86) PCT No.: PCT/CN2022/074978
    § 371 (c)(1),
    (2) Date: Feb. 27, 2023

(87) PCT Pub. No.: WO2023/142036
    PCT Pub. Date: Aug. 3, 2023

(65) Prior Publication Data
    US 2024/0276802 A1       Aug. 15, 2024

(51) Int. Cl.
    *H10K 59/131*          (2023.01)
    *H10K 59/12*          (2023.01)
    *H10K 59/65*          (2023.01)

(52) U.S. Cl.
    CPC ....... *H10K 59/131* (2023.02); *H10K 59/1201* (2023.02); *H10K 59/65* (2023.02)

(58) Field of Classification Search
    CPC ... H10K 59/131; H10K 59/65; G02F 1/13629
    See application file for complete search history.

(56)                References Cited

U.S. PATENT DOCUMENTS

2022/0115462 A1*    4/2022    Jung ..................... H10K 59/121
2022/0310736 A1*    9/2022    Seo ..................... H10K 59/1213
                    (Continued)

FOREIGN PATENT DOCUMENTS

CN          211789021 U      10/2020
CN          113241358 A       8/2021
                    (Continued)

*Primary Examiner* — Alia Sabur
(74) *Attorney, Agent, or Firm* — WHDA, LLP

(57)                ABSTRACT

A display substrate, including a light transmitting display region, a main display region and a transition region. The display substrate includes: a base substrate; a first light emitting unit located in the light transmitting display region; a first pixel circuit located in the transition region: a plurality of light transmitting conductive wires including a first conductive wire and a second conductive wire; a plurality of conductive parts located in the transition region, including a first conductive part and a second conductive part; and a first via hole penetrating a first planarization layer and electrically connecting the first conductive part with the second conductive part. An orthographic projection of the first conductive wire on the base substrate at least partially overlaps with that of the second conductive wire; and each of the orthographic projections is spaced from an orthographic projection of the first via hole on the base substrate.

14 Claims, 7 Drawing Sheets

(56) References Cited

U.S. PATENT DOCUMENTS

2022/0376028 A1    11/2022  Huang et al.
2023/0157069 A1*    5/2023  Ma ....................... H10K 59/124
                                                       257/40

FOREIGN PATENT DOCUMENTS

CN          214043706  U      8/2021
CN          113764462  A     12/2021

* cited by examiner

First direction

2331（233）

2611(261)

2311(231)

DISPLAY SUBSTRATE AND METHOD OF MANUFACTURING THE SAME, DISPLAY PANEL, AND DISPLAY DEVICE

CROSS REFERENCE

This application is a Section 371 National Stage Application of International Application No. PCT/CN2022/074978 filed on Jan. 29, 2022, the whole disclosure of which is incorporated herein by reference in its entirety.

TECHNICAL FIELD

The present disclosure relates to a field of display technology, and in particular to a display substrate and a method of manufacturing the same, a display panel, and a display device.

BACKGROUND

With a continuous iteration of the display technology, a full screen has gradually become a new trend of a display product development.

A key problem of the full screen is an arrangement of a front camera. In order to achieve a higher screen-to-body ratio, a notch screen, a water drop screen, a punch-hole screen and other display products have emerged one after another. Although these display products improved the screen-to-body ratio, it is still required to provide a camera hole on the screen to ensure a light input of the front camera, and a position corresponding to the camera hole on the screen does not have a display function. Therefore, these display products may not be referred to as a real full screen.

At present, the real full screen may be achieved through a under display camera technology. Specifically, the under display camera technology refers to a technology in which a front camera is provided under a screen and the screen above the front camera may still be able to display. When the front camera is in use, the screen above the camera allows an external light to pass through, so that the camera may acquire sufficient light input to achieve a camera function. When the front camera is not in use, the screen above the camera may display an image normally because a plurality of light emitting units are arranged in the screen above the camera. Therefore, from an appearance, the display screen using the under display camera may not have any camera hole, so that a display effect of the full screen may be truly achieved.

SUMMARY

The present disclosure provides a display substrate and a method of manufacturing the same, a display panel, and a display device.

According to a first aspect of the present disclosure, a display substrate is provided, including a light transmitting display region, a main display region at least partially surrounding the light transmitting display region, and a transition region between the light transmitting display region and the main display region, wherein the display substrate includes: a base substrate; a first light emitting unit arranged in the light transmitting display region on the base substrate; a first pixel circuit arranged in the transition region on the base substrate; a plurality of light transmitting conductive wires arranged on the base substrate, wherein at least one of the light transmitting conductive wires has a first end electrically connected to the first pixel circuit and a second end electrically connected to the first light emitting unit, the plurality of light transmitting conductive wires include a first conductive wire located in a first conductive wire layer and a second conductive wire located in a second conductive wire layer, and the first conductive wire and the second conductive wire extend from the transition region to the light transmitting display region in a first direction: a plurality of conductive parts arranged in the transition region on the base substrate, wherein the plurality of conductive parts include a first conductive part located in a first source/drain metal layer and a second conductive part located in a second source/drain metal layer; and a first via hole penetrating a first planarization layer located between the first source/drain metal layer and the second source/drain metal layer, and the first conductive part and the second conductive part are electrically connected through the first via hole; wherein the first source/drain metal layer is located on a side of the second source/drain metal layer away from the base substrate, the second conductive wire layer is located on a side of the first source/drain metal layer away from the base substrate, and the first conductive wire layer is located on a side of the second conductive wire layer away from the base substrate; wherein an orthographic projection of the first conductive wire on the base substrate at least partially overlaps with an orthographic projection of the second conductive wire on the base substrate; and the orthographic projection of each of the first conductive wire and the second conductive wire on the base substrate is spaced from an orthographic projection of the first via hole on the base substrate.

According to the embodiments of the present disclosure, the plurality of light transmitting conductive wires further include a third conductive wire located in a third conductive wire layer, and the third conductive wire extends from the transition region to the light transmitting display region in the first direction: wherein the third conductive wire layer is located between the second conductive wire layer and the first source/drain metal layer; wherein the orthographic projection of the first conductive wire on the base substrate and the orthographic projection of the second conductive wire on the base substrate at least partially overlap with an orthographic projection of the third conductive wire on the base substrate; and wherein the orthographic projection of the third conductive wire on the base substrate is spaced from the orthographic projection of the first via hole on the base substrate.

According to the embodiments of the present disclosure, the display substrate further includes: a second planarization layer arranged between the second conductive wire layer and the third conductive wire layer; a third planarization layer arranged on a side of the second planarization layer away from the base substrate and covering the first conductive wire and the second conductive wire; a first transfer part arranged in a first electrode layer on the base substrate: a second transfer part arranged in a fourth conductive wire layer on the base substrate; and a fourth planarization layer arranged between the fourth conductive wire layer and the first source/drain metal layer: wherein the first electrode layer is located on a side of the third planarization layer away from the base substrate, and the fourth conductive wire layer is located on a side of the second planarization layer close to the base substrate; and wherein for at least one of the first conductive wires, a first end of the first transfer part is electrically connected to a first end of the first conductive wire through a second via hole penetrating the third planarization layer, a second end of the first transfer part is electrically connected to a first end of the second transfer part through a third via hole penetrating the second planarization layer and the third planarization layer, and a second end of the second transfer part is electrically connected to the first conductive part through a fourth via hole penetrating the fourth planarization layer.

According to the embodiments of the present disclosure, the fourth conductive wire layer is arranged in the same layer as the third conductive wire layer.

According to the embodiments of the present disclosure, the display substrate further includes: a connection electrode arranged in a second electrode layer on the base substrate; wherein the first light emitting unit includes: a first electrode arranged in the second electrode layer on the base substrate; and a second electrode arranged in a third electrode layer on the base substrate; wherein the second electrode layer is arranged in the same layer as the first electrode layer, and the third electrode layer is located on a side of the second electrode layer away from the base substrate; and wherein one of the first electrode and the second electrode is an anode, and the other is a cathode, and the second end of the light transmitting conductive wire is electrically connected to the first electrode of the first light emitting unit through the connection electrode.

According to the embodiments of the present disclosure, the display substrate further includes: a second planarization layer arranged between the second conductive wire layer and the third conductive wire layer; a third planarization layer arranged on a side of the second planarization layer away from the base substrate and covering the first conductive wire and second conductive wire; a third transfer part and a fourth transfer part that are arranged in a fifth conductive wire layer on the base substrate; and a fifth planarization layer arranged between the fifth conductive wire layer and the second source/drain metal layer, wherein the fifth conductive wire layer is located on a side of the second planarization layer close to the base substrate; and wherein for at least one of the second conductive wires, a first end of the third transfer part is electrically connected to a first end of the second conductive wire through a fifth via hole penetrating the second planarization layer, and a second end of the third transfer part is electrically connected to the first conductive part through a sixth via hole penetrating the fifth planarization layer; a first end of the fourth transfer part is electrically connected to a second end of the second conductive wire through a seventh via hole penetrating the second planarization layer, and a second end of the fourth transfer part is electrically connected to the first light emitting unit through an eighth via hole penetrating the second planarization layer and the third planarization layer.

According to the embodiments of the present disclosure, the fifth conductive wire layer is arranged in the same layer as the third conductive wire layer.

According to the embodiments of the present disclosure, the orthographic projection of the first conductive wire on the base substrate coincides with the orthographic projection of the second conductive wire on the base substrate.

According to the embodiments of the present disclosure, the display substrate further includes: an inorganic insulation part arranged in an inorganic insulation layer on the base substrate; wherein the inorganic insulation layer is located between the first conductive wire layer and the second conductive wire layer; and wherein the orthographic projection of the first conductive wire on the base substrate and the orthographic projection of the second conductive wire on the base substrate coincides with an orthographic projection of the inorganic insulation part on the base substrate.

According to the embodiments of the present disclosure, the first conductive wire, the second conductive wire and the inorganic insulation part are formed by a one-time patterning process.

According to a second aspect of the present disclosure, a display panel is provided, including the display substrate described above.

According to a third aspect of the present disclosure, a display device is provided, including the display panel described above.

According to a fourth aspect of the present disclosure, a method of manufacturing a display substrate is provided, the display substrate including a light transmitting display region, a main display region at least partially surrounding the light transmitting display region, and a transition region between the light transmitting display region and the main display region, wherein the method includes: providing a base substrate; forming a first pixel circuit, a plurality of conductive parts and a first via hole in the transition region on the base substrate, wherein the plurality of conductive parts include a first conductive part located in a first source/drain metal layer and a second conductive part located in a second source/drain metal layer, the first via hole penetrates a first planarization layer located between the first source/drain metal layer and the second source/drain metal layer, and the first conductive part and the second conductive part are electrically connected through the first via hole; forming a first light emitting unit in the light transmitting display region on the base substrate; and forming a plurality of light transmitting conductive wires on the base substrate, wherein at least one of the light transmitting conductive wires has a first end electrically connected to the first pixel circuit and a second end electrically connected to the first light emitting unit, the plurality of light transmitting conductive wires include a first conductive wire located in a first conductive wire layer and a second conductive wire located in a second conductive wire layer, and the first conductive wire and the second conductive wire extend from the transition region to the light transmitting display region in a first direction; wherein the first source/drain metal layer is located on a side of the second source/drain metal layer away from the base substrate, the second conductive wire layer is located on a side of the first source/drain metal layer away from the base substrate, and the first conductive wire layer is located on a side of the second conductive wire layer away from the base substrate; wherein an orthographic projection of the first conductive wire on the base substrate at least partially overlaps with an orthographic projection of the second conductive wire on the base substrate; and wherein the orthographic projection of each of the first conductive wire and the second conductive wire on the base substrate is spaced from an orthographic projection of the first via hole on the base substrate.

According to the embodiments of the present disclosure, the display substrate further includes a second planarization layer arranged on a side of the second conductive wire layer close to the base substrate, and the forming a plurality of light transmitting conductive wires on the base substrate includes: forming a first light transmitting conductive material layer on a side of the second planarization layer away from the base substrate; forming an inorganic insulation material layer on a side of the first light transmitting conductive material layer away from the base substrate; forming a second light transmitting conductive material layer on a side of the inorganic insulation material layer away from the base substrate; and patterning the first light transmitting conductive material layer, the inorganic insulation material layer and the second light transmitting conductive material layer through a one-time patterning process to obtain the first conductive wire, the second conductive wire and an inorganic insulation part located in an inorganic insulation layer; wherein the inorganic insulation layer is located between the first conductive wire layer and the second conductive wire layer; and wherein the orthographic projection of the first conductive wire on the base substrate and the orthographic projection of the second conductive wire on the base substrate coincide with an orthographic projection of the inorganic insulation part on the base substrate.

BRIEF DESCRIPTION OF THE DRAWINGS

The above and other objectives, features and advantages of the present disclosure will be more apparent through the following descriptions of the embodiments of the present disclosure with reference to the accompanying drawings.

DETAILED DESCRIPTION OF EMBODIMENTS

Figure 1:
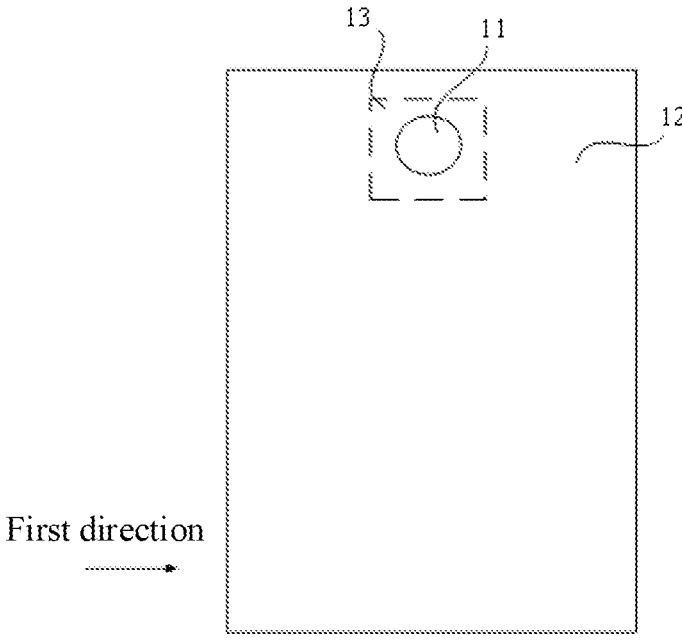
FIG. 1 schematically shows a plan view of a display substrate in a comparative example.

In order to make objectives, technical solutions and advantages of the present disclosure clearer, technical solutions of the embodiments of the present disclosure will be clearly and completely described below with reference to the accompanying drawings. Obviously, the described embodiments are merely some embodiments of the present disclosure, rather than all the embodiments. Based on the described embodiments of the present disclosure, all additional embodiments obtained by those ordinary skilled in the art without carrying out inventive effort fall within the scope of protection of the present disclosure.

It should be noted that, in the accompanying drawings, for clarity and/or description purposes, a size and a relative size of an element may be enlarged. Accordingly, the size and relative size of each element are not required to be limited to those shown in the drawings. In the specification and the accompanying drawings, the same or similar reference numerals indicate the same or similar components.

When an element is described as being "on", "connected to" or "coupled to" another element, the element may be directly on the other element, directly connected to the other element, or directly coupled to the other element, or an intermediate element may be provided. However, when an element is described as being "directly on", "directly connected to" or "directly coupled to" another element, no intermediate element is provided. Other terms and/or expressions used to describe a relationship between elements, such as "between" and "directly between", "adjacent" and "directly adjacent", "on" and "directly on", and so on, should be interpreted in a similar manner. In addition, the term "connection" may refer to a physical connection, an electrical connection, a communication connection, and/or a fluid connection. In addition, X-axis, Y-axis and Z-axis are not limited to three axes of a rectangular coordinate system, and may be interpreted in a broader meaning. For example, the X-axis, the Y-axis and the Z-axis may be perpendicular to each other, or may represent different directions that are not perpendicular to each other. For objectives of the present disclosure, "at least one of X, Y and Z" and "at least one selected from a group consisting of X, Y and Z" may be interpreted as only X, only Y, only Z, or any combination of two or more of X, Y and Z, such as XYZ, XY, YZ and XZ. As used herein, the term "and/or" includes any and all combinations of one or more of the listed related items.

It should be noted that although terms "first", "second", and so on may be used herein to describe various components, members, elements, regions, layers and/or parts, these components, members, elements, regions, layers and/or parts should not be limited by these terms. Rather, these terms are used to distinguish one component, member, element, region, layer and/or part from another. Thus, for example, a first component, a first member, a first element, a first region, a first layer and/or a first part discussed below may be referred to as a second component, a second member, a second element, a second region, a second layer and/or a second part without departing from teachings of the present disclosure.

For ease of description, spatial relationship terms such as "upper", "lower", "left". "right", may be used herein to describe a relationship between one element or feature and another element or feature as shown in the drawings. It should be understood that the spatial relationship terms are intended to cover other different orientations of a device in use or operation in addition to an orientation described in the drawing. For example, if a device in the drawing is turned upside down, an element described as "below" or "under" another element will be oriented as "above" or "on" the another element.

Those skilled in the art should understand that herein, unless otherwise specified, an expression "thickness" refers to a size in a direction perpendicular to a surface of a display panel provided with various film layers, that is, a size in a light exit direction of the display panel.

Herein, unless otherwise specified, an expression "patterning process" generally includes steps of photoresist coating, exposure, development, etching, and photoresist stripping. An expression "one-time patterning process" means a process of forming patterned layers, components, elements and so on by using one mask.

It should be noted that expressions "the same layer", "arranged in the same layer" or similar expressions refer to a layer structure that is formed by firstly forming a film layer for forming a specific pattern by using a same film forming process, and then patterning the film layer through a one-time patterning process by using a same mask Depending on different specific patterns, the one-time patterning process may include a plurality of exposure, development or etching processes, and the specific pattern in the layer structure formed may be continuous or discontinuous. These specific patterns may also be located at different heights or have different thicknesses.

Herein, unless otherwise specified, an expression "electrically connected" may mean that two components or elements are directly electrically connected. For example, a component or element A is in direct contact with a component or element B, and an electrical signal may be transmitted between the two. It may also mean that two components or elements are electrically connected through a conductive medium such as a conductive wire. For example, a component or element A is electrically connected to a component or element B through a conductive wire so as to transmit an electrical signal between the two. It may also mean that two components or elements are electrically connected through at least one electronic component. For example, a component or element A is electrically connected to a component or element B through at least one thin film transistor so as to transmit an electrical signal between the two.

Figure 2:
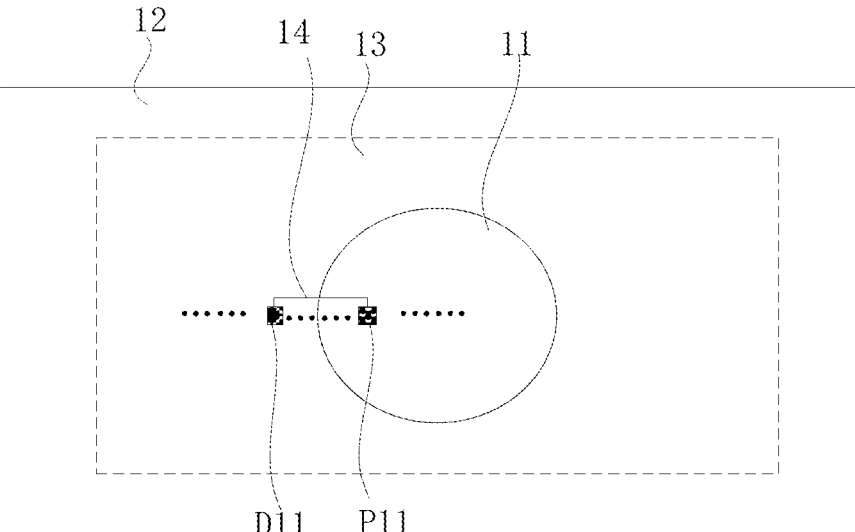
FIG. 2 schematically shows a plan view of a light transmitting conductive region and a transition region in a comparative example.

FIG. 1 schematically shows a plan view of a display substrate in a comparative example. As shown in FIG. 1, in the comparative example, the display substrate includes a light transmitting display region 11, a main display region 12 surrounding the light transmitting display region 11, and a transition region 13 between the light transmitting display region 11 and the main display region 12. In the comparative example, in order to enable a camera module arranged in the light transmitting display region 11 to acquire sufficient external light, a pixel circuit in the light transmitting display region 11 is transferred to the transition region 13, and the pixel circuit in the transition region 13 is electrically connected to a light emitting unit in the light transmitting display region 11 through a light transmitting conductive wire. Specifically. FIG. 2 schematically shows a plan view of a light transmitting conductive region and a transition region in a comparative example. As shown in FIG. 2, the light transmitting display region 11 includes a plurality of first light emitting units P11, and the transition region 13 includes a plurality of first pixel circuits D11. Exemplarily, each first light emitting unit P11 corresponds to one first pixel circuit D11. Each first pixel circuit in the transition region 13 is electrically connected to a first light emitting unit P11 corresponding to the first pixel circuit D11 in the light transmitting display region 11 through a light transmitting conductive wire 14, so that the light transmitting display region 11 achieves a display function through the first light emitting units and the first pixel circuits.

Optionally, a plurality of second pixel circuits (not shown) and a plurality of second light emitting units (not shown) are further provided in the transition region 13. Exemplarily, at least one second pixel circuit is provided between two first pixel circuits D11 adjacent in a first direction, and the second light emitting units are respectively electrically connected to the second pixel circuits, so that the transition region 13 achieves the display function through the second light emitting units and the second pixel circuits.

Figure 3:
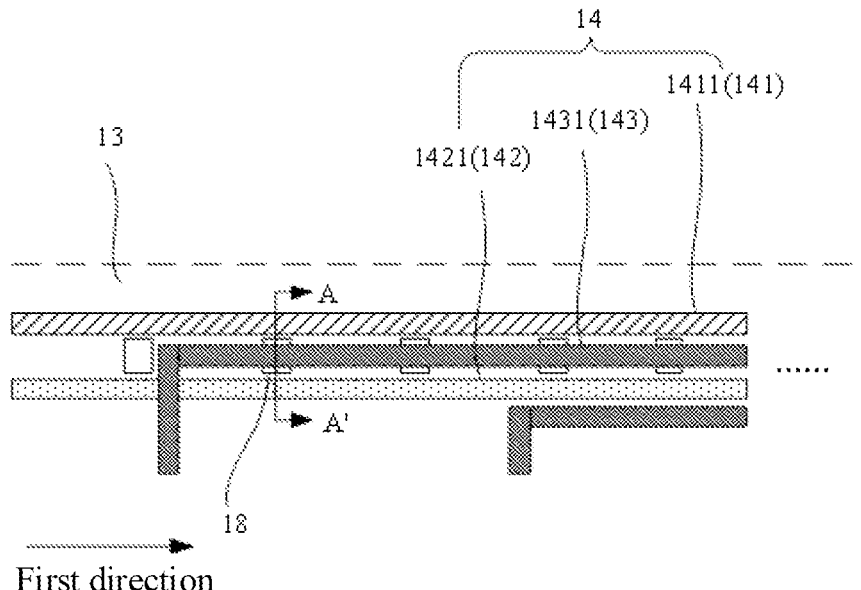
FIG. 3 schematically shows a plan view of a light transmitting conductive wire in a transition region in a comparative example.
Figure 4:
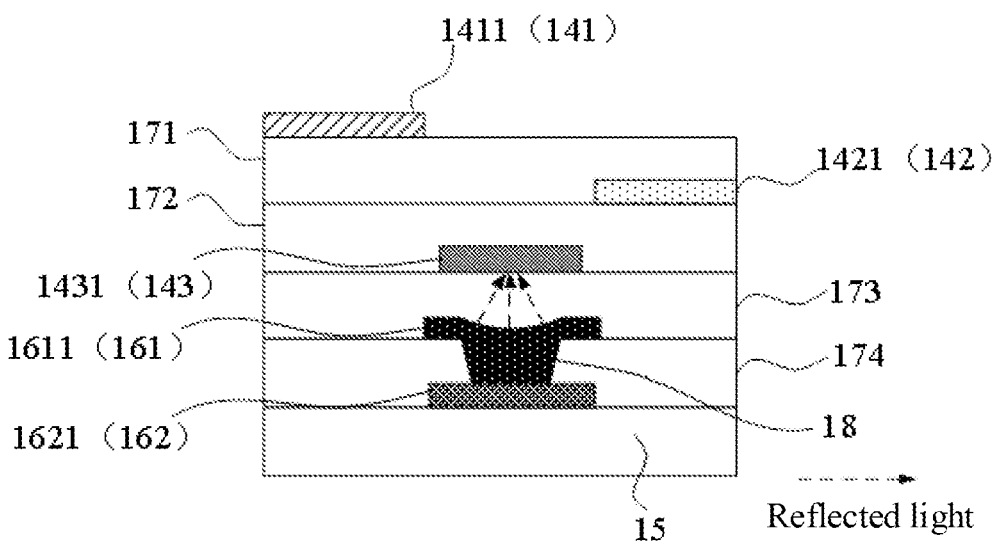
FIG. 4 schematically shows a cross-sectional view of FIG. 3 taken along a section line AX.

FIG. 3 schematically shows a plan view of a light transmitting conductive wire in a transition region in a comparative example, and FIG. 4 schematically shows a cross-sectional view of FIG. 3 taken along a section line AA'. With reference to FIG. 1 to FIG. 4, in the comparative example, the display substrate includes a base substrate 15; and the plurality of light transmitting conductive wires 14 include: a first conductive wire 1411 arranged in a first conductive wire layer 141 on the base substrate 15, a second conductive wire 1421 arranged in a second conductive wire layer 142 on the base substrate 15, and a third conductive wire 1431 arranged in a third conductive wire layer 143 on the base substrate 15 and located. The first conductive wire layer 141, the second conductive wire layer 142 and the third conductive wire layer 143 are sequentially arranged in a direction close to the base substrate 15. Optionally, the display substrate may further include: a first planarization layer 171 arranged between the first conductive wire layer 141 and the second conductive wire layer 142, and a second planarization layer 172 arranged between the second conductive wire layer 142 and the third conductive wire layer 143.

The first conductive wire 1411, the second conductive wire 1421 and the third conductive wire 1431 all extend in the first direction. An orthographic projection of the first conductive wire 1411 on the base substrate 15, an orthographic projection of the second conductive wire 1421 on the base substrate 15 and an orthographic projection of the third conductive wire 1431 on the base substrate 15 do not overlap with each other. For example, any of the orthographic projection of the first conductive wire 1411 on the base substrate 15, the orthographic projection of the second conductive wire 1421 on the base substrate 15 and the orthographic projection of the third conductive wire 1431 on the base substrate 15 is located in a gap between orthographic projections of other light transmitting conductive wires 14 on the base substrate 15. The first direction may refer to a row direction of the display substrate, that is, a horizontal direction in FIG. 2.

In the comparative example, the display substrate further includes a first conductive part 1611 arranged in a first source/drain metal layer 161 on the base substrate 15, a second conductive part 1621 arranged in a second source/drain metal layer 162 on the base substrate 15, a third planarization layer 173 located between the third conductive wire layer 143 and the first source/drain metal layer 161, and a fourth planarization layer 174 located between the first source/drain metal layer 161 and the second source/drain metal layer 162. The first conductive part 1611 is electrically connected to the second conductive part 1621 through a first via hole 18 arranged on the first planarization layer 17. The first source/drain metal layer 161 is located on a side of the second source/drain metal layer 162 away from the base substrate 15.

Optionally, the first conductive part 1611 may be electrically connected to various signal lines on the display substrate, and the second conductive part 1621 may be electrically connected to a corresponding transistor in the first pixel circuit D11, so that an electrical signal for display provided by a signal line may be transmitted to the first pixel circuit D11 through the first conductive part 1611 and the second conductive part 1621.

Optionally, the first conductive part 1611 may be further electrically connected to the light transmitting conductive wire 14, and the second conductive part 1621 is electrically connected to the corresponding transistor in the first pixel circuit D11, so that an electrical signal output by the first pixel circuit D11 may be transmitted to the corresponding first light emitting unit P11 through the second conductive part 1621, the first conductive part 1611 and the light transmitting conductive wire 14.

With a higher requirement for a pixel density of the light transmitting display region 11, a number of the first light emitting units P11 in the light transmitting display region 11 increases, and a number of the light transmitting conductive wires 14 for electrical connection increases accordingly. Since the orthographic projection of the first conductive wire 1411 on the base substrate 15, the orthographic projection of the second conductive wire 1421 on the base substrate 15 and the orthographic projection of the third conductive wire 1431 on the base substrate 15 do not overlap with each other, as shown in FIG. 3, the light transmitting conductive wire 14 may inevitably cover the first via hole 18, that is, an orthographic projection of the light transmitting conductive wire 14 on the base substrate 15 overlaps with an orthographic projection of the first via hole 18 on the base substrate 15.

The inventors found through research that, as shown in FIG. 4, a part of the first conductive part 1611 located above the first via hole 18 (that is, a side of the first via hole 18 away from the base substrate 15) may be depressed by a certain extent. Since the first conductive part 1611 is typically made of a metal material, the first conductive part 1611 has an ability to reflect light by a certain extent, and the depression part of the first conductive part 1611 has a function similar to that of a concave lens to gather light, which may cause the light reflected by the first conductive part 1611 to converge on the light transmitting conductive wire 14 so that the light transmitting conductive wire 14 may be burnt off, and causing a poor display.

Figure 5:
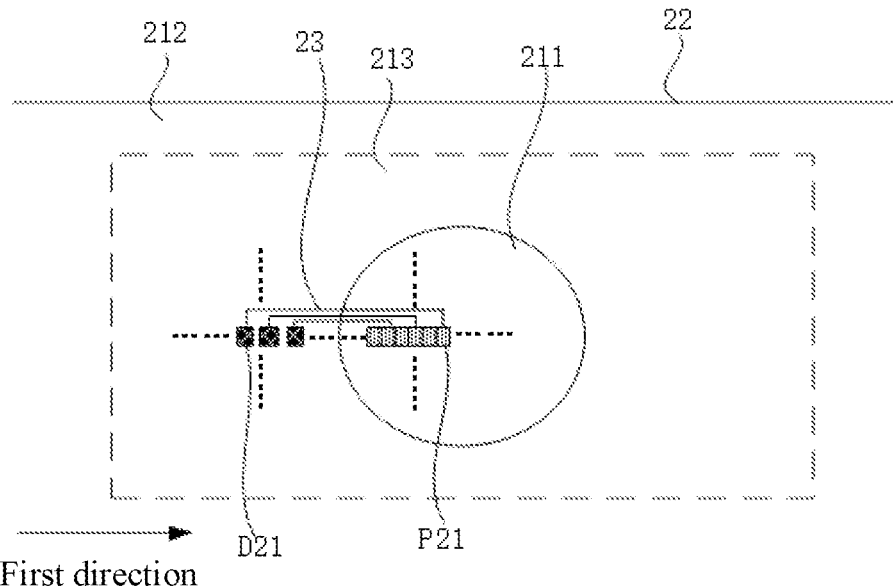
FIG. 5 schematically shows a plan view of a light transmitting display region and a transition region in a display substrate in the embodiments of the present disclosure.

In view of this, the embodiments of the present disclosure provide a display substrate. FIG. 5 schematically shows a plan view of a light transmitting display region and a transition region in a display substrate in the embodiments of the present disclosure. As shown in FIG. 5, the display substrate of the embodiments of the present disclosure includes a light transmitting display region 211, a main display region 212 at least partially surrounding the light transmitting display region 211, and a transition region 213 between the light transmitting display region 211 and the main display region 212. Continuing to refer to FIG. 5, the display substrate further includes: a base substrate 22, a first light emitting unit P21 arranged in the light transmitting display region 211 on the base substrate 22, a first pixel circuit D21 arranged in the transition region 213 on the base substrate 22, and a plurality of light transmitting conductive wires 23 arranged on the base substrate 22. Optionally, a material of the light transmitting conductive wire 23 may include a transparent conductive material, such as indium tin oxide (ITO), indium zinc oxide (IZO), and the like.

Figure 6:
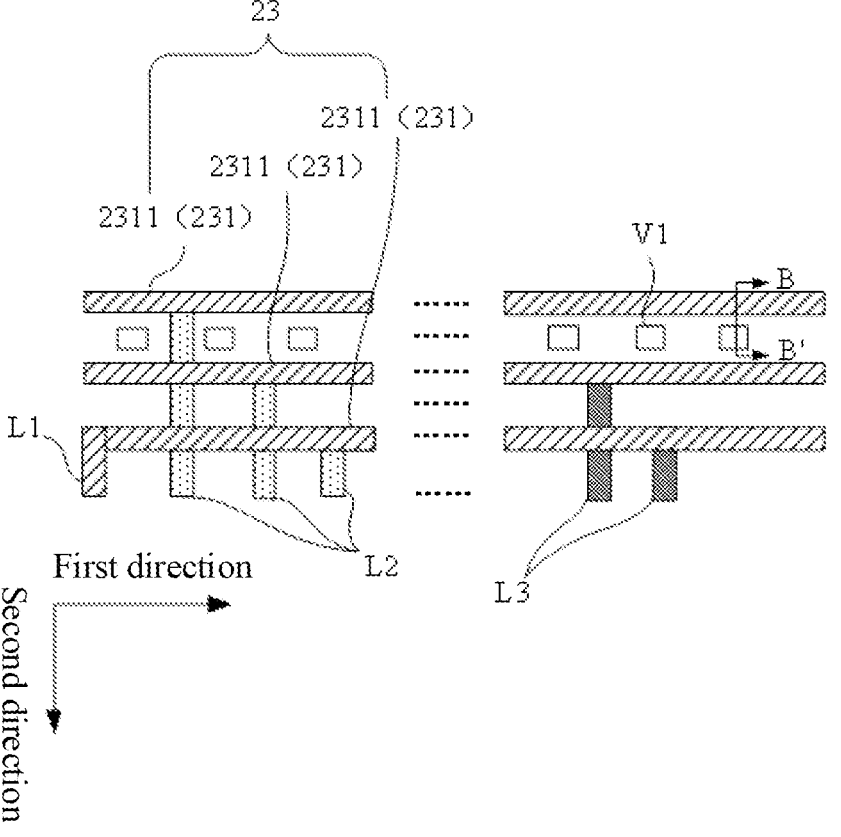
FIG. 6 schematically shows a first plan view of a light transmitting conductive wire in a transition region in the embodiments of the present disclosure.
Figure 7:
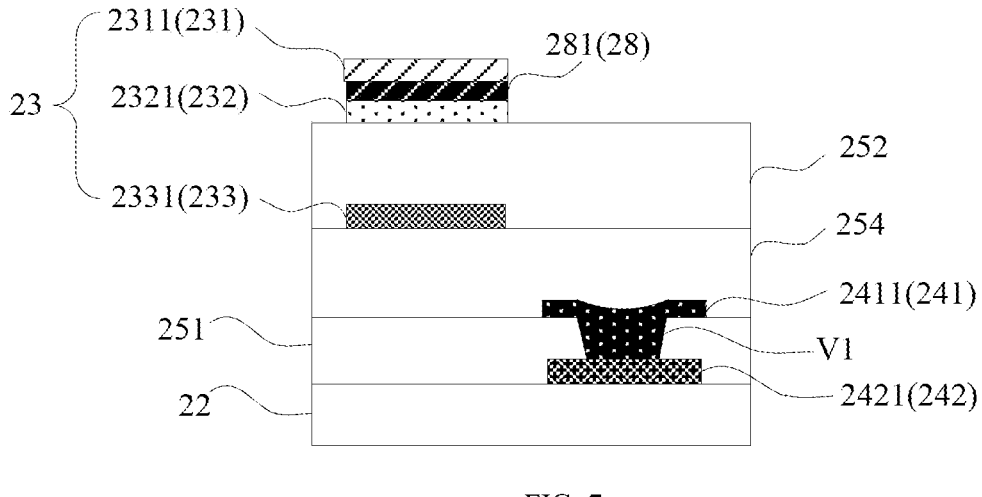
FIG. 7 schematically shows a cross-sectional view of FIG. 6 taken along a section line BB'.

FIG. 6 schematically shows a first plan view of a light transmitting conductive wire in a transition region in the embodiments of the present disclosure, and FIG. 7 schematically shows a cross-sectional view of FIG. 6 taken along a section line BB'. With reference to FIG. 5 to FIG. 7, the display substrate further includes a plurality of conductive parts and a first via hole V1 arranged in the transition region 213 on the base substrate 22. The plurality of conductive parts include a first conductive part 2411 located in a first source/drain metal layer 241 and a second conductive part 2421 located in a second source/drain metal layer 242. The first via hole V1 penetrates a first planarization layer 251 located between the first source/drain metal layer 241 and the second source/drain metal layer 242. The first conductive part 2411 and the second conductive part 2421 are electrically connected through the first via hole V1.

Continuing to refer to FIG. 5 to FIG. 7, at least one light transmitting conductive wire 23 has a first end electrically connected to the first pixel circuit D21, and a second end electrically connected to the first light emitting unit P21. The plurality of light transmitting conductive wires 23 include a first conductive wire 2311 located in a first conductive wire layer 231 and a second conductive wire 2321 located in a second conductive wire layer 232. The first conductive wire 2311 and the second conductive wire 2321 extend from the transition region 213 to the light transmitting display region 211 in the first direction.

The first source/drain metal layer 241 is located on a side of the second source/drain metal layer 242 away from the base substrate 22, the second conductive wire layer 232 is located on a side of the first source/drain metal layer 241 away from the base substrate 22, and the first conductive wire layer 231 is located on a side of the second conductive wire layer 232 away from the base substrate 22.

An orthographic projection of the first conductive wire 2311 on the base substrate 22 at least partially overlaps with an orthographic projection of the second conductive wire 2321 on the base substrate 22. Furthermore, each of the orthographic projection of the first conductive wire 2311 on the base substrate 22 and the orthographic projection of the second conductive wire 2321 on the base substrate 22 is spaced from an orthographic projection of the first via hole V1 on the base substrate 22.

In the embodiments of the present disclosure, the light transmitting display region 211 includes a region provided with an under display camera in the display substrate. When the under display camera is in use, the light transmitting display region 211 allows external light to pass through, so that the under display camera may acquire sufficient light input to achieve a camera function. When the under display camera is not in use, the first light emitting units P21 in the light transmitting display region 211 may display.

Exemplarily, the first light emitting units P21 correspond to the first pixel circuits D21 in one-to-one correspondence. In the embodiments of the present disclosure, the first end of each light transmitting conductive wire 23 is electrically connected to one first pixel circuit D21, the second end of each light transmitting conductive wire is electrically connected to the first light emitting unit P21 corresponding to the first pixel circuit D21, and different light transmitting conductive wires 23 are electrically connected to different first pixel circuits D21.

Optionally, the fast light emitting unit P21 includes a light emitting device, which may include an organic light emitting diode (OLED) or a quantum dot light emitting diode (QLED) or the like.

Optionally, the first conductive part 2411 may be electrically connected to various signal lines on the display substrate, and the second conductive part 2421 may be electrically connected to a corresponding transistor in the first pixel circuit D21, so that an electrical signal for display provided by a signal line may be transmitted to the first pixel circuit D21 through the first conductive part 2411 and the second conductive part 2421. For example, the signal line may include a high-level voltage signal line (ELVDD), and other transistors may include an input transistor, and so on, which may be specifically determined according to actual needs, which is not limited here.

Optionally, the first conductive part 2411 may be further electrically connected to the light transmitting conductive wire 23, and the second conductive part 2421 is electrically connected to the corresponding transistor in the first pixel circuit D21, so that an electrical signal output by the first pixel circuit D21 may be transmitted to the corresponding first light emitting unit P21 through the second conductive part 2421, the first conductive part 2411 and the light transmitting conductive wire 23.

For example, the first pixel circuit D21 includes a drive transistor arranged on the base substrate, and the drive transistor is configured to provide a drive current in response to a voltage difference between a gate electrode and a first electrode of the drive transistor. As shown in FIG. 6, the second conductive part 2421 may be electrically connected to a second electrode of the drive transistor, and the first end of each light transmitting conductive wire 23 may be electrically connected to the first conductive part 2421 through a connection line arranged in the same layer as the light transmitting conductive wire 23, thereby achieving an electrical connection with the first pixel circuit D21. In this way, the drive current generated by the drive transistor may be transmitted to the light transmitting conductive wire 23 through the second conductive part 2421, the first conductive part 2411 and the connection line, and then transmitted to the corresponding first light emitting unit P21 through the light transmitting conductive wire 23 to drive the first light emitting unit P21 to emit light.

Figure 8:
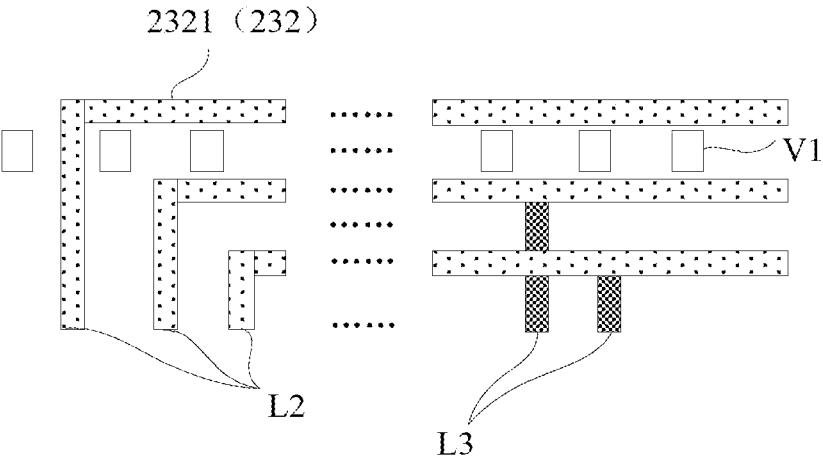
FIG. 8 schematically shows a second plan view of a light transmitting conductive wire in a transition region in the embodiments of the present disclosure.
Figure 9:
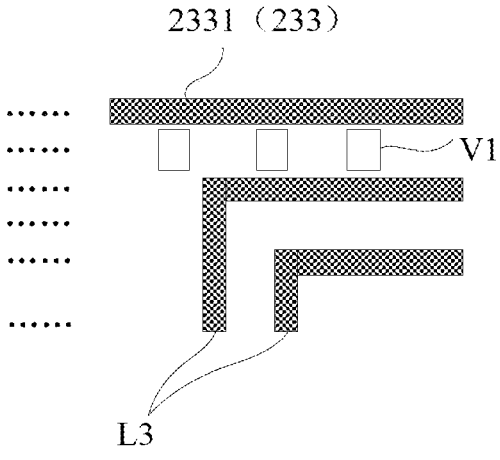
FIG. 9 schematically shows a third plan view of a light transmitting conductive wire in a transition region in the embodiments of the present disclosure.

For example, FIG. 8 schematically shows a second plan view of a light transmitting conductive wire in a transition region in the embodiments of the present disclosure, and FIG. 9 schematically shows a third plan view of a light transmitting conductive wire in a transition region in the embodiments of the present disclosure. Different from FIG. 6, the first conductive wire layer 231 is hidden in FIG. 8, and the first conductive wire layer 231 and the second conductive wire layer 232 are hidden in FIG. 9. With reference to FIG. 6, FIG. 8 and FIG. 9, the display substrate includes a first connection line L1, a first connection line L2 and a first connection line U. The first connection line L1, the first connection line L2 and the first connection line L3 all extend in a second direction, and the second direction intersects with the first direction, for example, the second direction is perpendicular to the fast direction. The first connection line L1 is located in the first conductive wire layer 231, the first connection line L2 is located in the second conductive wire layer 232, and the first connection line L3 is located in the third conductive wire layer 233. A first end of the first light transmitting conductive wire 2311 is electrically connected to the first conductive part 2421 through the first connection line L1, a first end of the second light transmitting conductive wire 2321 is electrically connected to the first conductive part 2421 through the first connection line L2, and a first end of the third light transmitting conductive wire 2331 is electrically connected to the first conductive part 2421 through the first connection line L3.

Optionally, the first pixel circuit may include a 7T2C circuit. The so-called 7T2C circuit refers to a pixel circuit having seven thin film transistors (7T) and two storage capacitors (2C), and its structure may be determined according to actual needs, which is not limited here. Optionally, the second conductive part 2421 being electrically connected to the second electrode of the drive transistor may be specifically that: the second conductive part 2421 is electrically connected to the second electrode of the drive transistor through a light-emission control transistor, and the light-emission control transistor is configured to connect or disconnect the second conductive part 2421 and the second electrode of the drive transistor in response to a light-emission control signal.

In the embodiments of the present disclosure, the first conductive wire 2311 and the second conductive wire 2321 extend in the first direction, and the orthographic projection of the first conductive wire 2311 on the base substrate 22 at least partially overlaps with the orthographic projection of the second conductive wire 2321 on the base substrate 22. For example, the first direction may refer to the row direction of the display substrate, that is, the horizontal direction in FIG. 2. The orthographic projection of the second conductive wire 2321 on the base substrate 22 is located within the orthographic projection of the first conductive wire 2311 on the base substrate. Alternatively, the orthographic projection of the first conductive wire 2311 on the base substrate 22 may coincide with the orthographic projection of the second conductive wire 2321 on the base substrate 22.

As described above, in the embodiments of the present disclosure, the first conductive wire 2311 and the second conductive wire 2321 extend in the first direction, and the orthographic projection of the first conductive wire 2311 on the base substrate 22 at least partially overlaps with the orthographic projection of the second conductive wire 2321 on the base substrate 22. That is, the first conductive wire 2311 and the second conductive wire 2321 are stacked in a thickness direction of the display substrate. Compared with the solution in the comparative example that the orthographic projection of the first conductive wire 141 on the base substrate does not overlap with the orthographic projection of the second conductive wire 142 on the base substrate, the display substrate of the embodiments of the present disclosure may reduce an area occupied by the light transmitting conductive wire 23 in the transition region 23 without reducing the pixel density of the light transmitting display region 211. On this basis, by spacing the orthographic projection of each of the first conductive wire 2311 and the orthographic projection of the second conductive wire 2321 on the base substrate 22 from the orthographic projection of the first via hole V1 on the base substrate 22, the first via hole V1 may be exposed by the light transmitting conductive wire 23 in the transition region 23, so that the light from the first conductive part 2411 above the first via hole V1 (that is, on a side of the first via hole V1 away from the base substrate 22) may be prevented from converging on the light transmitting conductive wire 23, thus a problem of burning the light transmitting conductive wire 23 may be avoided, and a product quality may be improved.

The display substrate of the embodiments of the present disclosure will be further described below.

In some specific embodiments, the plurality of light transmitting conductive wires 23 may further include a third conductive wire 2331 located in a third conductive wire layer 233, and the third conductive wire 2331 extends from the transition region 213 to the light transmitting display region 211 in the first direction.

The third conductive wire layer 233 is located between the second conductive wire layer 232 and the first source/drain metal layer 241. The orthographic projection of the first conductive wire 2311 on the base substrate 22 and the orthographic projection of the second conductive wire 2321 on the base substrate 22 at least partially overlap with an orthographic projection of the third conductive wire 2331 on the base substrate 22. The orthographic projection of the third conductive wire 2331 on the base substrate 22 is spaced from the orthographic projection of the first via hole V1 on the base substrate 22.

In the embodiments of the present disclosure, the display substrate may further include more light transmitting conductive wires 23, which may be located in different layers from the first conductive wire 2311, the second conductive wire 2321 and the third conductive wire 2331 described above. For example, the display substrate may further include a fourth conductive wire, and a layer of the fourth conductive wire may be located on a side of the first conductive wire layer 231 away from the base substrate 22.

In the embodiments of the present disclosure, the light transmitting conductive wires 23 located in different layers may be stacked in the above-mentioned manner. For example, when the display substrate further includes the fourth conductive wire, the first conductive wire 2311, the second conductive wire 2321, the third conductive wire 2331 and the fourth conductive wire may all extend in the first direction. The orthographic projection of the first conductive wire 2311 on the base substrate 22, the orthographic projection of the second conductive wire 2321 on the base substrate 22, the orthographic projection of the third conductive wire 2331 on the base substrate 22 and the orthographic projection of the fourth conductive wire on the base substrate 22 at least partially overlap with each other, and the orthographic projection of the fourth conductive wire on the base substrate 22 is spaced from the orthographic projection of the first via hole V1 on the base substrate 22. In this way, more light transmitting conductive wires 23 may be provided without changing the area occupied by the light transmitting conductive wire 23 in the transition region 213. At the same time, for any light transmitting conductive wire 23, the first via hole V1 may be exposed to prevent the light reflected by the first conductive part 2411 from burning the light transmitting conductive wire 23.

In the embodiments of the present disclosure, the transition region 213 may include a first sub-region, a second sub-region and a third sub-region arranged in the first direction. The first sub-region is located on a side of the second sub-region away from the light transmitting display region 211, and the third sub-region is located on a side of the second sub-region close to the light transmitting display region 211. The first pixel circuit D21 is provided in the first sub-region, the second sub-region and the third sub-region. The first conductive wire 2311 may be electrically connected to a first pixel circuit D21 in the first sub-region. The first conductive wire 2311 may extend continuously from the first sub-region to the light transmitting display region 211 in the first direction, and then electrically connected to the corresponding first light emitting unit P21 in the light transmitting display region 211. The second conductive wire 2321 may be electrically connected to a first pixel circuit D21 in the second sub-region. The second conductive wire 2321 may extend continuously from the second sub-region to the light transmitting display region 211 in the first direction, and then electrically connected to the corresponding first light emitting unit P21 in the light transmitting display region 211. The third conductive wire 2331 may be electrically connected to a first pixel circuit D21 in the third sub-region. The third conductive wire 2331 may extend continuously from the third sub-region to the light transmitting display region 211 in the first direction, and then electrically connected to the corresponding first light emitting unit P21 in the light transmitting display region 211.

It should be noted that which of the first conductive wire 2311, the second conductive wire 2321 and the third conductive wire 2331 extends from the first sub-region to the light transmitting display region 211 may be determined according to actual needs. For example, the third conductive wire 2331 may be electrically connected to a first pixel circuit D21 in the first sub-region, and the third conductive wire 2331 extends continuously from the first sub-region to the light transmitting display region 211 in the first direction, and so on, which will not be listed in the embodiments of the present disclosure.

In some specific embodiments, the first conductive wire 2311 and the second conductive wire 2321 may be prepared by a one-time patterning process, that is, the first conductive wire 2311 and the second conductive wire 2321 may have the same pattern. At this time, the first conductive wire 2311 and the second conductive wire 2321 may be connected to the first pixel circuit D21 and the first light emitting unit P21 through a transfer part.

The method of connecting the first conductive wire 2311 with the first pixel circuit D21 and the first light emitting unit P21 through the transfer part is described below.

Figure 10:
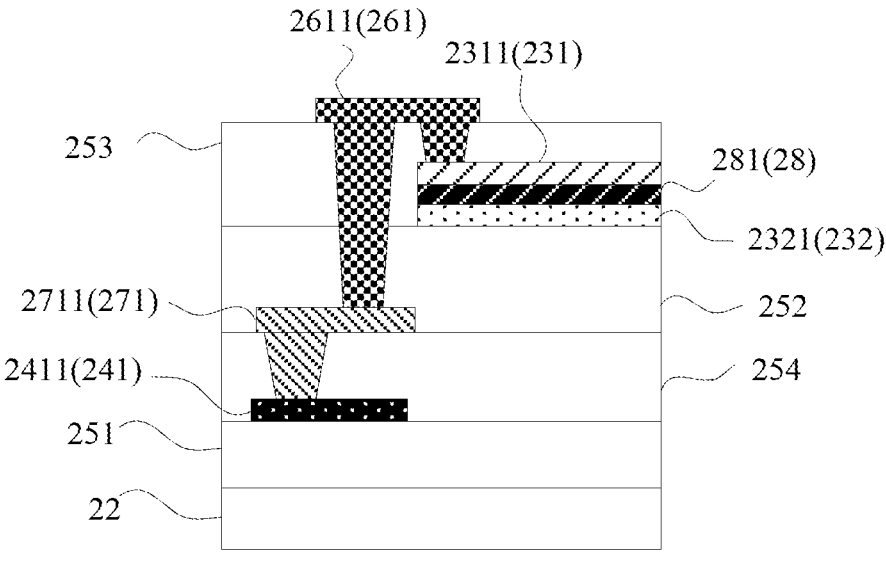
FIG. 10 schematically shows a first schematic diagram of electrically connecting a first conductive wire through a transfer part in the embodiments of the present disclosure.

FIG. 10 schematically shows a first schematic diagram of electrically connecting a first conductive wire through a transfer part in the embodiments of the present disclosure. As shown in FIG. 10, in some specific embodiments, the display substrate further includes: a second planarization layer 252 arranged between the second conductive wire layer 232 and the third conductive wire layer 233, a third planarization layer 253 arranged on a side of the second planarization layer 252 away from the base substrate 22 and covering the first conductive wire 2311 and the second conductive wire 2321, a first transfer part 2611 arranged in a first electrode layer 261 on the base substrate 22, a second transfer part 2711 arranged in a fourth conductive wire layer 271 on the base substrate 22, and a fourth planarization layer 254 arranged between the fourth conductive wire layer 271 and the first source/drain metal layer 241.

The first electrode layer 261 is located on a side of the third planarization layer 253 away from the base substrate 22, and the fourth conductive wire layer 271 is located on a side of the second planarization layer 252 close to the base substrate 22. For at least one first conductive wire 2311, a first end of the first transfer part 2611 is electrically connected to the first end of the first conductive wire 2311 through a second via hole penetrating the third planarization layer 253. Optionally, the first end of the first transfer part 2611 may be electrically connected to the above-mentioned first connection line L1 through the second via hole penetrating the third planarization layer 253, and then electrically connected to the first end of the first conductive wire 2311 through the first connection line L1. A second end of the first transfer part 2611 is electrically connected to a first end of the second transfer part 2711 through a third via hole V3 penetrating the second planarization layer 252 and the third planarization layer 253, and a second end of the second transfer part 2711 is electrically connected to the first conductive part 2411 through a fourth via hole V4 penetrating the fourth planarization layer 254.

In some specific embodiments, the fourth conductive wire layer 271 and the third conductive wire layer 233 are arranged in the same layer, that is, the fourth conductive wire layer 271 and the third conductive wire layer 233 are formed by a one-time patterning process.

Figure 11:
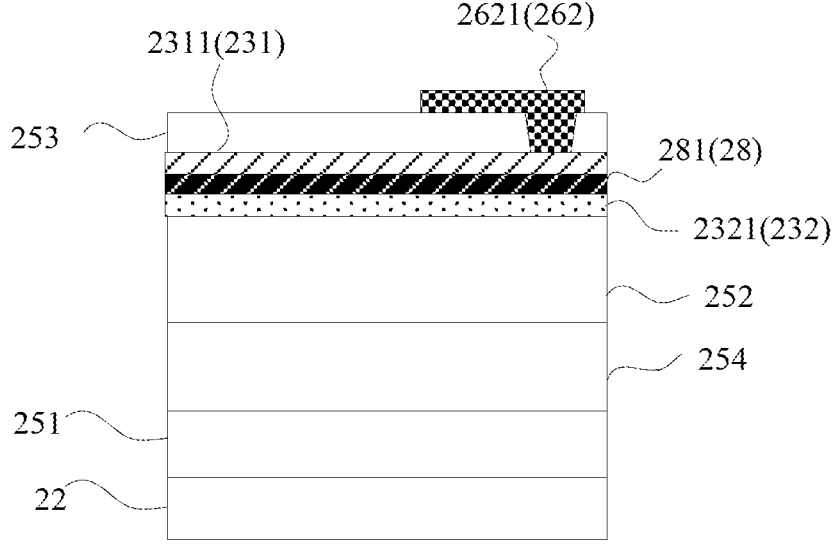
FIG. 11 schematically shows a second schematic diagram of electrically connecting a first conductive wire through a transfer part in the embodiments of the present disclosure.

FIG. 11 schematically shows a second schematic diagram of electrically connecting a first conductive wire through a transfer part in the embodiments of the present disclosure. As shown in FIG. 11, in some specific embodiments, the display substrate further includes: a connection electrode 2621 arranged in a second electrode layer 262 on the base substrate 22.

The second end of the light transmitting conductive wire 23 is electrically connected to the first light emitting unit P21 through the connection electrode 2621, and the second electrode layer 262 is arranged in the same layer as the first electrode layer 261. Optionally, the second end of the light transmitting conductive wire 23 may be electrically connected to the connection electrode 2621 through a second connection line (not shown), and the second connection line may extend in the above-mentioned second direction.

In the embodiments of the present disclosure, the plurality of first light emitting units P21 may include a variety of colors. For example, the plurality of first light emitting units P21 may include a red light emitting unit, a green light emitting unit and a blue light emitting unit. The first light emitting unit P21 includes: a first electrode (not shown) arranged in the second electrode layer 262 on the base substrate 22, a second electrode (not shown) arranged in a third electrode layer on the base substrate 22, and a light emitting part (not shown) arranged in a light emitting functional layer on the base substrate 22.

The third electrode layer is located on a side of the second electrode layer 262 away from the base substrate 22, and the light emitting functional layer is located between the second electrode layer 262 and the third electrode layer. One of a first electrode and a second electrode is an anode, and the other is a cathode. For example, the first electrode is the anode and the second electrode is the cathode. The second end of the light transmitting conductive wire 23 may be electrically connected to a first electrode of the first light emitting unit P21 through the connection electrode 2621. The light emitting part is configured to emit light in response to electrical signals of the first electrode and the second electrode. The light emitting part may include a multilayer structure, for example, the light emitting part may include a hole injection layer, a hole transport layer, an organic light emitting layer, an electron transport layer, an electron injection layer, and the like.

The method of connecting the second conductive wire 2321 with the first pixel circuit D21 and the first light emitting unit P21 through the transfer part will be described below.

Figure 12:
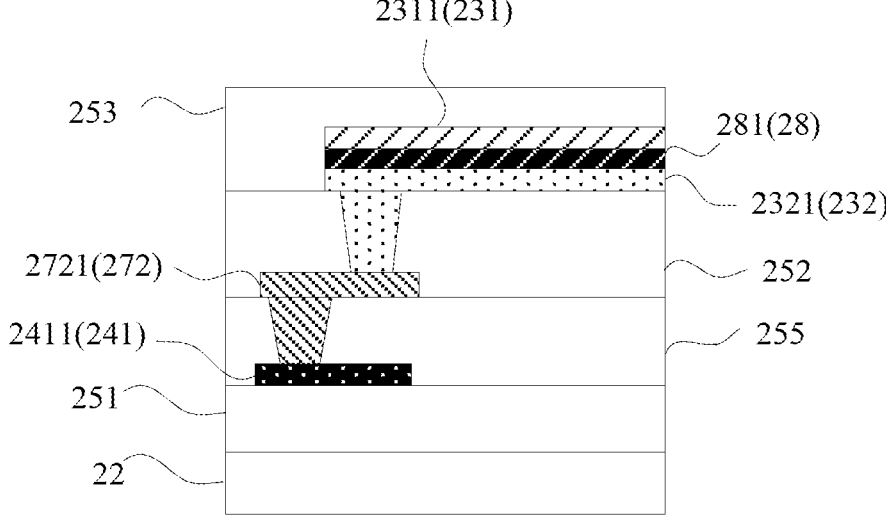
FIG. 12 schematically shows a first schematic diagram of electrically connecting a second conductive wire through a transfer part in the embodiments of the present disclosure.
Figure 13:
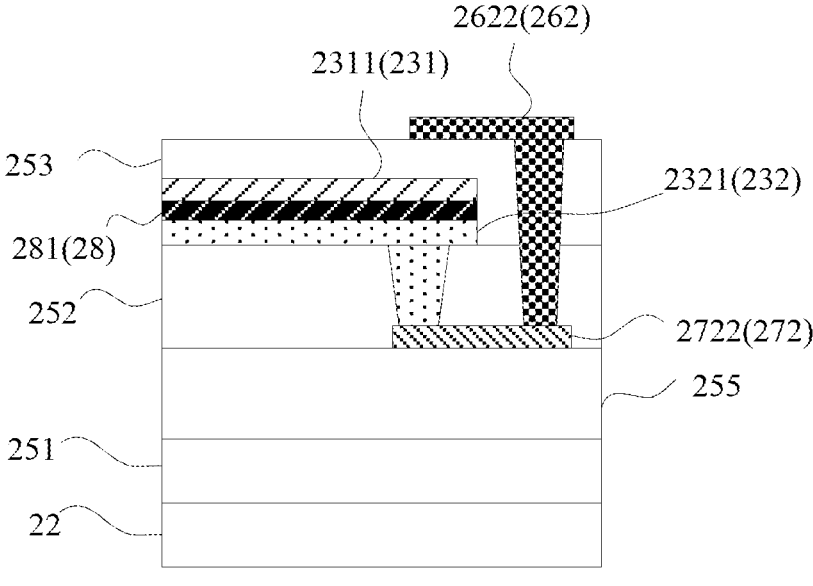
FIG. 13 schematically shows a second schematic diagram of electrically connecting a second conductive wire through a transfer part in the embodiments of the present disclosure.

FIG. 12 schematically shows a first schematic diagram of electrically connecting a second conductive wire through a transfer part in the embodiments of the present disclosure, and FIG. 13 schematically shows a second schematic diagram of electrically connecting a second conductive wire through a transfer part in the embodiments of the present disclosure. With reference to FIG. 12 and FIG. 13, in some specific embodiments, the display substrate further includes: a second planarization layer 252 arranged between the second conductive wire layer 232 and the third conductive wire layer 233, a third planarization layer 253 arranged on a side of the second planarization layer 252 away from the base substrate 22 and covering the first conductive wire 2311 and the second conductive wire 2321, a third transfer part 2721 and a fourth transfer part 2722 which are arranged in a fifth conductive wire layer 272 on the base substrate 22, and a fifth planarization layer 255 arranged between the fifth conductive wire layer 272 and the second source/drain metal layer 242.

The fifth conductive wire layer 272 is located on a side of the second planarization layer 252 close to the base substrate 22. For at least one second conductive wire 2321, a first end of the third transfer part 2721 is electrically connected to the first end of the second conductive wire 2321 through a fifth via hole penetrating the second planarization layer 252. Optionally, the first end of the third transfer part 2721 may be firstly electrically connected to the first connection line L2 described above through the fifth via hole, and then electrically connected to the first end of the second conductive wire 2321 through the first connection line L2. A second end of the third transfer part 2721 is electrically connected to the first conductive part 2411 through a sixth via hole penetrating the fifth planarization layer 255. A first end of the fourth transfer part 2722 is electrically connected to the second end of the second conductive wire 2321 through a seventh via hole penetrating the second planarization layer 252. Optionally, the first end of the fourth transfer part 2722 may be electrically connected to the second end of the second conductive wire 2321 through the second connection line, and the second connection line may extend in the aforementioned second direction. A second end of the fourth transfer part 2722 is electrically connected to the light emitting unit through an eighth via hole penetrating the second planarization layer 252 and the third planarization layer 253. For example, the second end of the fourth transfer part 2722 is electrically connected to the connection electrode 2621 through the eighth via hole, and then electrically connected to the first electrode of the first light emitting unit P21 through the connection electrode 2621.

In some specific embodiments, the fifth conductive wire layer 272 and the third conductive wire layer 233 are arranged in the same layer, that is, in the embodiments of the present disclosure, the fifth conductive wire layer, the fourth conductive wire layer 271 and the third conductive wire layer 233 are formed by a one-time patterning process.

In the embodiments of the present disclosure, when manufacturing the display substrate, the second transfer part 2711 and the third transfer part 2721 may be formed first by a one-time patterning process on a side of the fourth planarization layer 254 away from the base substrate 22. Then, the second planarization layer 252 is formed on a side of the layer of the second transfer part 2711 and the third transfer part 2721 away from the base substrate 22, and an initial via hole is formed on the second planarization layer 252. Next, a first conductive material for preparing the second conductive wire 2321 is formed on a side of the second planarization layer 252 away from the base substrate 22, while the first conductive material is in contact with the second transfer part 2711 and the third transfer part 2721 through the initial via hole. Then, when performing the patterning process on the first conductive material, the first conductive material in a part of the initial via hole is removed (that is, the first conductive material in contact with the second transfer part 2711 is removed). This part of the initial via hole is used to communicate with a via hole on the third planarization layer 253 to form the third via hole in a subsequent step, while the initial via hole retained with the first conductive material is used as the fifth via hole.

In some specific embodiments, the orthographic projection of the first conductive wire 2311 on the base substrate 22 coincides with the orthographic projection of the second conductive wire 2321 on the base substrate 22, that is, the first conductive wire 2311 and the second conductive wire 2321 have the same pattern.

In some specific embodiments, the display substrate further includes an inorganic insulation part 281 arranged in an inorganic insulation layer 28 on the base substrate 22. The inorganic insulation layer 28 is located between the first conductive wire layer 231 and the second conductive wire layer 232. The orthographic projection of the first conductive wire 2311 on the base substrate 22 and the orthographic projection of the second conductive wire 2321 on the base substrate 22 coincide with an orthographic projection of the inorganic insulation part 281 on the base substrate 22.

In the embodiments of the present disclosure, a material of the inorganic insulation layer 28 may contain silicon oxide, silicon nitride, silicon oxynitride and so on. A thickness of the inorganic insulation layer 28 may be set between 500 angstroms and 5000 angstroms.

In some specific embodiments, the first conductive wire 2311, the second conductive wire 2321 and the inorganic insulation part 281 are formed by a one-time patterning process.

In the embodiments of the present disclosure, the first conductive wire 2311 and the second conductive wire 2321 may be insulated and separated by using the inorganic insulation part 281, so that the inorganic insulation layer 28 may be used to replace the planarization layer originally arranged between the first conductive wire layer 231 and the second conductive wire layer 232. In this way, since the inorganic insulation part 281 may be formed using the same etching method as the first conductive wire 2311 and the second conductive wire 2321, the first conductive wire 2311, the second conductive wire 2321 and the inorganic insulation part 281 may be formed by an one-time patterning process, so that the first conductive wire 2311 and the second conductive wire 2321 that originally needed to be formed by a multi-step patterning process may be formed by one-time patterning process, thereby reducing a production cost.

Figure 14:
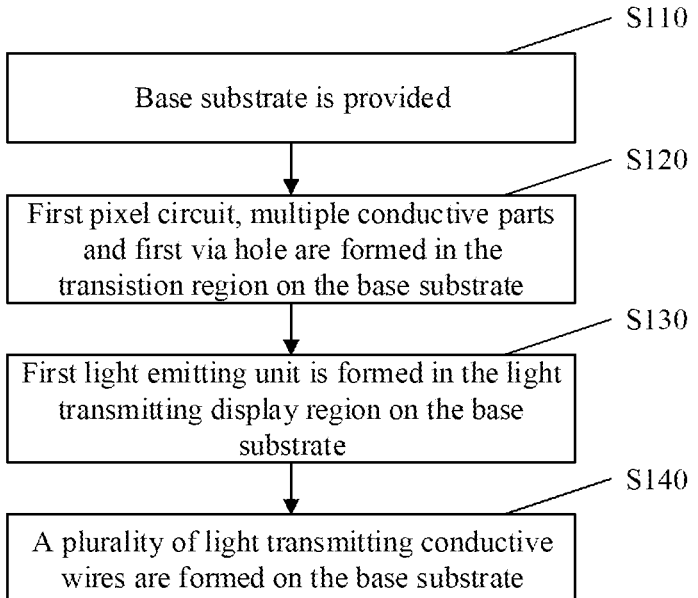
FIG. 14 schematically shows a flowchart of a method of manufacturing a display substrate according to the embodiments of the present disclosure.

The present disclosure further provides a method of manufacturing a display substrate. The display substrate includes a light transmitting display region, a main display region at least partially surrounding the light transmitting display region, and a transition region between the light transmitting display region and the main display region. FIG. 14 schematically shows a flowchart of a method of manufacturing a display substrate according to the embodiments of the present disclosure. As shown in FIG. 14, the method of the embodiments of the present disclosure includes step S110 to step S140.

In step S110, a base substrate is provided.

In step S120, a first pixel circuit, a plurality of conductive parts and a first via hole are formed in a transition region on the base substrate. The plurality of conductive parts include a first conductive part located in a first source/drain metal layer and a second conductive part located in a second source/drain metal layer. The first via hole penetrates a first planarization layer located between the first source/drain metal layer and the second source/drain metal layer, and the first conductive part and the second conductive part are electrically connected through the first via hole.

In step S130, a first light emitting unit is formed in the light transmitting display region on the base substrate.

In step S140, a plurality of light transmitting conductive wires are formed on the base substrate. At least one light transmitting conductive wire has a first end electrically connected to the first pixel circuit, and a second end electrically connected to the first light emitting unit. The plurality of light transmitting conductive wires include a first conductive wire located in a first conductive wire layer and a second conductive wire located in a second conductive wire layer. Both first conductive wire and second conductive wire extend from the transition region to the light transmitting display region in a first direction.

The first source/drain metal layer is located on a side of the second source/drain metal layer away from the base substrate, the second conductive wire layer is located on a side of the first source/drain metal layer away from the base substrate, and the first conductive wire layer is located on a side of the second conductive wire layer away from the base substrate.

An orthographic projection of the first conductive wire on the base substrate at least partially overlaps with an orthographic projection of the second conductive wire on the base substrate.

The orthographic projection of each of the first conductive wire and the second conductive wire on the base substrate is spaced from an orthographic projection of the first via hole on the base substrate.

The display substrate manufactured by the manufacture method of the embodiments of the present disclosure may reduce the area of the light transmitting conductive wire in the transition region without reducing the pixel density of the light transmitting display region. On this basis, by spacing the orthographic projection of each of the first conductive wire and the second conductive wire on the base substrate from the orthographic projection of the first via hole on the base substrate, the first via hole may be exposed by the light transmitting conductive wire in the transition region, so that the light from the first conductive part above the first via hole (that is, on a side of the first via hole away from the base substrate) may be prevented from converging on the light transmitting conductive wire, thus the problem of burning the light transmitting conductive wire may be avoided, and the product quality may be improved.

In some specific embodiments, the display substrate further includes a second planarization layer arranged on a side of the second conductive wire layer close to the base substrate, and step S140 includes step S141 to step S144.

In step S141, a first light transmitting conductive material layer is formed on a side of the second planarization layer away from the base substrate.

In step S142, an inorganic insulation material layer is formed on a side of the first light transmitting conductive material layer away from the base substrate.

In step S143, a second light transmitting conductive material layer is formed on a side of the inorganic insulation material layer away from the base substrate.

In step S144, the first light transmitting conductive material layer, the inorganic insulation material layer and the second light transmitting conductive material layer are patterned through a one-time patterning process to obtain the first conductive wire, the second conductive wire and the inorganic insulation part located in the inorganic insulation layer.

The inorganic insulation layer is located between the first conductive wire layer and the second conductive wire layer. The orthographic projection of the fast conductive wire on the base substrate and the orthographic projection of the second conductive wire on the base substrate coincide with the orthographic projection of the inorganic insulation part on the base substrate.

With the manufacture method of the embodiments of the present disclosure, the first conductive wire and the second conductive wire that originally needed to be formed by a multi-step patterning process may be formed using the one-time patterning process, so that the production cost may be reduced.

It should be noted that other descriptions in embodiments of the present disclosure may refer to the aforementioned embodiments, which will not be described in detail here.

The present disclosure further provides a display panel including the display substrate described above.

The present disclosure further provides a display device including the display panel described above.

In other embodiments of the present disclosure, the display device may include a tablet personal computer (PC), a smart phone, a personal digital assistant (PDA), a portable multimedia player, a game console, or a wrist watch-type electronic device, etc. However, the embodiments of the present disclosure are not intended to limit the type of the display device. In some exemplary embodiments, the display device may be used not only in a large electronic device such as a television (Tt) or an external billboard, etc., but also in a medium or small electronic device such as a PC, a laptop computer, a vehicle navigation device or a camera, etc.

Those skilled in the art may understand that features recited in various embodiments and/or claims of the present disclosure may be combined in various ways, even if such combinations are not explicitly recited in the present disclosure. In particular, the features recited in various embodiments and/or claims of the present disclosure may be combined and/or incorporated in various ways without departing from the spirit and teachings of the present disclosure. All these combinations and/or incorporations fall within the scope of the present disclosure.

The embodiments of the present disclosure have been described above. However, these embodiments are merely for purpose of illustration, and are not intended to limit the scope of the present disclosure. Although various embodiments have been described separately above, this does not mean that measures in the various embodiments may not be used in combination advantageously. The scope of the present disclosure is defined by the appended claims and their equivalents. Various substitutions and modifications may be made by those skilled in the art without departing from the scope of the present disclosure, and these substitutions and modifications should all fall within the scope of the present disclosure.

What is claimed is:

1. A display substrate, comprising a light transmitting display region, a main display region at least partially surrounding the light transmitting display region, and a transition region between the light transmitting display region and the main display region, wherein the display substrate comprises:
   a base substrate;
   a first light emitting unit arranged in the light transmitting display region on the base substrate;
   a first pixel circuit arranged in the transition region on the base substrate;
   a plurality of light transmitting conductive wires arranged on the base substrate, wherein at least one of the light transmitting conductive wires has a first end electrically connected to the first pixel circuit and a second end electrically connected to the first light emitting unit, the plurality of light transmitting conductive wires comprise a first conductive wire located in a first conductive wire layer and a second conductive wire located in a second conductive wire layer, and the first conductive wire and the second conductive wire extend from the transition region to the light transmitting display region in a first direction;
   a plurality of conductive parts arranged in the transition region on the base substrate, wherein the plurality of conductive parts comprise a first conductive part located in a first source/drain metal layer and a second conductive part located in a second source/drain metal layer; and a first via hole penetrating a first planarization layer located between the first source/drain metal layer and the second source/drain metal layer, and the first conductive part and the second conductive part are electrically connected through the first via hole;
   wherein the first source/drain metal layer is located on a side of the second source/drain metal layer away from the base substrate, the second conductive wire layer is located on a side of the first source/drain metal layer away from the base substrate, and the first conductive wire layer is located on a side of the second conductive wire layer away from the base substrate;
   wherein an orthographic projection of the first conductive wire on the base substrate at least partially overlaps with an orthographic projection of the second conductive wire on the base substrate; and
   wherein the orthographic projection of each of the first conductive wire and the second conductive wire on the base substrate is spaced from an orthographic projection of the first via hole on the base substrate.

2. The display substrate according to claim 1, wherein the plurality of light transmitting conductive wires further comprise a third conductive wire located in a third conductive wire layer, and the third conductive wire extends from the transition region to the light transmitting display region in the first direction;
   wherein the third conductive wire layer is located between the second conductive wire layer and the first source/drain metal layer;
   wherein the orthographic projection of the first conductive wire on the base substrate and the orthographic projection of the second conductive wire on the base substrate at least partially overlap with an orthographic projection of the third conductive wire on the base substrate; and
   wherein the orthographic projection of the third conductive wire on the base substrate is spaced from the orthographic projection of the first via hole on the base substrate.

3. The display substrate according to claim 2, wherein the display substrate further comprises:
   a second planarization layer arranged between the second conductive wire layer and the third conductive wire layer;
   a third planarization layer arranged on a side of the second planarization layer away from the base substrate and covering the first conductive wire and the second conductive wire;
   a first transfer part arranged in a first electrode layer on the base substrate;
   a second transfer part arranged in a fourth conductive wire layer on the base substrate; and
   a fourth planarization layer arranged between the fourth conductive wire layer and the first source/drain metal layer;
   wherein the first electrode layer is located on a side of the third planarization layer away from the base substrate, and the fourth conductive wire layer is located on a side of the second planarization layer close to the base substrate; and
   wherein for at least one of the first conductive wires, a first end of the first transfer part is electrically connected to a first end of the first conductive wire through a second via hole penetrating the third planarization layer, a second end of the first transfer part is electrically connected to a first end of the second transfer part through a third via hole penetrating the second planarization layer and the third planarization layer, and a second end of the second transfer part is electrically connected to the first conductive part through a fourth via hole penetrating the fourth planarization layer.

4. The display substrate according to claim 3, wherein the fourth conductive wire layer is arranged in the same layer as the third conductive wire layer.

5. The display substrate according to claim 3, wherein the display substrate further comprises:

a connection electrode arranged in a second electrode layer on the base substrate;

wherein the first light emitting unit comprises:

a first electrode arranged in the second electrode layer on the base substrate; and a second electrode arranged in a third electrode layer on the base substrate;

wherein the second electrode layer is arranged in the same layer as the first electrode layer, and the third electrode layer is located on a side of the second electrode layer away from the base substrate; and wherein one of the first electrode and the second electrode is an anode, and the other is a cathode, and the second end of the light transmitting conductive wire is electrically connected to the first electrode of the first light emitting unit through the connection electrode.

6. The display substrate according to claim 2, wherein the display substrate further comprises:

a second planarization layer arranged between the second conductive wire layer and the third conductive wire layer;

a third planarization layer arranged on a side of the second planarization layer away from the base substrate and covering the first conductive wire and second conductive wire;

a third transfer part and a fourth transfer part that are arranged in a fifth conductive wire layer on the base substrate; and a fifth planarization layer arranged between the fifth conductive wire layer and the second source/drain metal layer;

wherein the fifth conductive wire layer is located on a side of the second planarization layer close to the base substrate; and wherein for at least one of the second conductive wires, a first end of the third transfer part is electrically connected to a first end of the second conductive wire through a fifth via hole penetrating the second planarization layer, and a second end of the third transfer part is electrically connected to the first conductive part through a sixth via hole penetrating the fifth planarization layer; a first end of the fourth transfer part is electrically connected to a second end of the second conductive wire through a seventh via hole penetrating the second planarization layer, and a second end of the fourth transfer part is electrically connected to the first light emitting unit through an eighth via hole penetrating the second planarization layer and the third planarization layer.

7. The display substrate according to claim 6, wherein the fifth conductive wire layer is arranged in the same layer as the third conductive wire layer.

8. The display substrate according to claim 1, wherein the orthographic projection of the first conductive wire on the base substrate coincides with the orthographic projection of the second conductive wire on the base substrate.

9. The display substrate according to claim 1, wherein the display substrate further comprises:

an inorganic insulation part arranged in an inorganic insulation layer on the base substrate;

wherein the inorganic insulation layer is located between the first conductive wire layer and the second conductive wire layer; and wherein the orthographic projection of the first conductive wire on the base substrate and the orthographic projection of the second conductive wire on the base substrate coincides with an orthographic projection of the inorganic insulation part on the base substrate.

10. The display substrate according to claim 9, wherein the first conductive wire, the second conductive wire and the inorganic insulation part are formed by a one-time patterning process.

11. A display panel, comprising the display substrate according to claim 1.

12. A display device, comprising the display panel according to claim 11.

13. A method of manufacturing a display substrate, the display substrate comprising a light transmitting display region, a main display region at least partially surrounding the light transmitting display region, and a transition region between the light transmitting display region and the main display region, wherein the method comprises:

providing a base substrate;

forming a first pixel circuit, a plurality of conductive parts and a first via hole in the transition region on the base substrate, wherein the plurality of conductive parts comprise a first conductive part located in a first source/drain metal layer and a second conductive part located in a second source/drain metal layer, the first via hole penetrates a first planarization layer located between the first source/drain metal layer and the second source/drain metal layer, and the first conductive part and the second conductive part are electrically connected through the first via hole;

forming a first light emitting unit in the light transmitting display region on the base substrate; and forming a plurality of light transmitting conductive wires on the base substrate, wherein at least one of the light transmitting conductive wires has a first end electrically connected to the first pixel circuit and a second end electrically connected to the first light emitting unit, the plurality of light transmitting conductive wires comprise a first conductive wire located in a first conductive wire layer and a second conductive wire located in a second conductive wire layer, and the first conductive wire and the second conductive wire extend from the transition region to the light transmitting display region in a first direction;

wherein the first source/drain metal layer is located on a side of the second source/drain metal layer away from the base substrate, the second conductive wire layer is located on a side of the first source/drain metal layer away from the base substrate, and the first conductive wire layer is located on a side of the second conductive wire layer away from the base substrate;

wherein an orthographic projection of the first conductive wire on the base substrate at least partially overlaps with an orthographic projection of the second conductive wire on the base substrate; and wherein the orthographic projection of each of the first conductive wire and the second conductive wire on the base substrate is spaced from an orthographic projection of the first via hole on the base substrate.

14. The method according to claim 13, wherein the display substrate further comprises a second planarization layer arranged on a side of the second conductive wire layer close to the base substrate, and the forming a plurality of light transmitting conductive wires on the base substrate comprises:

forming a first light transmitting conductive material layer on a side of the second planarization layer away from the base substrate;

forming an inorganic insulation material layer on a side of the first light transmitting conductive material layer away from the base substrate;

forming a second light transmitting conductive material layer on a side of the inorganic insulation material layer away from the base substrate; and patterning the first light transmitting conductive material layer, the inorganic insulation material layer and the second light transmitting conductive material layer through a one-time patterning process to obtain the first conductive wire, the second conductive wire and an inorganic insulation part located in an inorganic insulation layer;

wherein the inorganic insulation layer is located between the first conductive wire layer and the second conductive wire layer; and wherein the orthographic projection of the first conductive wire on the base substrate and the orthographic projection of the second conductive wire on the base substrate coincide with an orthographic projection of the inorganic insulation part on the base substrate.

* * * * *